US 7,400,284 B1

(12) United States Patent
Lei et al.

(10) Patent No.: US 7,400,284 B1
(45) Date of Patent: Jul. 15, 2008

(54) LOW NOISE DATA CONVERSION CIRCUITS AND METHODS AND SYSTEMS USING THE SAME

(75) Inventors: Tom Gong Lei, Austin, TX (US); Bruce Eliot Duewer, Austin, TX (US); Stephen Timothy Hodapp, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 895 days.

(21) Appl. No.: 10/811,715

(22) Filed: Mar. 29, 2004

(51) Int. Cl.
*H03M 1/66* (2006.01)

(52) U.S. Cl. ........................ 341/144; 341/143

(58) Field of Classification Search .............. 341/144, 341/143, 150; 375/245
See application file for complete search history.

(56) References Cited

U.S. PATENT DOCUMENTS

| 6,344,816 | B1* | 2/2002 | Dedic | 341/144 |
| 6,670,902 | B1* | 12/2003 | Melanson et al. | 341/143 |
| 6,985,532 | B2* | 1/2006 | Batra et al. | 375/245 |
| 7,049,879 | B2* | 5/2006 | Osamura et al. | 327/419 |

* cited by examiner

*Primary Examiner*—Rexford Barnie
*Assistant Examiner*—Joseph Lauture
(74) *Attorney, Agent, or Firm*—Thompson & Knight LLP; James J. Murphy

(57) ABSTRACT

A circuit including a first element sampling noise from and discharging noise to a signal line in response to an input signal transitioning on selected edges of a clock signal. A second element samples noise from and discharges noise to the signal line in response to another input signal transitioning on other edges of the clock signal differing from the selected edges of the clock signal such that noise coupled into substrate and supply are independent of the input signal.

28 Claims, 7 Drawing Sheets

LOW NOISE DATA CONVERSION CIRCUITS AND METHODS AND SYSTEMS USING THE SAME

FIELD OF THE INVENTION

The present invention relates in general to mixed—signal circuits and methods and in particular to low—noise data conversion circuits and methods and systems using the same.

BACKGROUND OF INVENTION

Noise and harmonic distortion in mixed-signal circuitry, such as digital to analog and analog to digital converters (DACs and ADCs), comes from a number of sources. For example, the voltages at the summing nodes in some operational amplifier circuits do not completely settle after switching operations, resulting in high frequency noise on the corresponding signal lines. This high frequency noise is then sampled onto the parasitic capacitance within the circuitry and subsequently folded-back into the signal baseband during later switching operations. Unacceptable noise and distortion can also be the result of an inadequate power supply rejection ratio (PSRR) within the various circuits and current "kicks" on the signal lines caused by the switching of unbalanced loads.

In noise sensitive applications, including audio processing, the minimization of distortion and noise are critical design factors, since often their ultimate effect is perceptible to the end-user. However, designing to minimize noise and harmonic distortion presents significant challenges, especially when other design factors must be considered, such as circuit complexity, chip area, and power consumption.

SUMMARY OF INVENTION

The principles of the present invention generally provide noise reduction techniques suitable for applications such as data converters with significant out of band noise and similar circuitry. According to one particular embodiment of these principles, a circuit is disclosed including a first element sampling noise from and discharging noise to a signal line in response to an input signal transitioning on selected edges of a clock signal. A second element samples noise from and discharges noise to the signal line in response to another input signal transitioning on other edges of the clock signal differing from the selected edges of the clock signal such that the sampling and discharging frequency on the signal line is independent on the of the input signal and the other input signal.

In another embodiment of the inventive principles, a data conversion element selectively switches a parasitic capacitance to the signal line in response to the input signal. An associated dummy circuit switches a matching parasitic capacitance to the signal line in response to the complement of the input signal.

In a further embodiment of the inventive principles, a dummy conversion element selectively switches a parasitic capacitance to the signal line in response to the another input signal. A dummy circuit switches a matching parasitic capacitance to the signal line in response to the complement of the another input signal.

By utilizing a dummy conversion element, which switches a matching load to the signal line on clock edges differing from the clock edges timing the switching of the load of the data conversion element to the signal line, the sampling transitions due to parasitic capacitance become independent of the input signal. The mixing of high frequencies on the signal lines due to sampling is more controlled, such that fold back of noise into the signal baseband can be minimized.

Switching a parasitic capacitance, matched to the parasitic capacitance of the data conversion element to the signal line in response to the complement of the input signal improves the power supply rejection ratio, lowers the differential "kick" on the signal line, and makes the load on the signal line independent of the input data. A similar technique is advantageously applied to the dummy conversion element using the complement of the other input signal.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-5 of the drawings, in which like numbers designate like parts.

Figure 1:
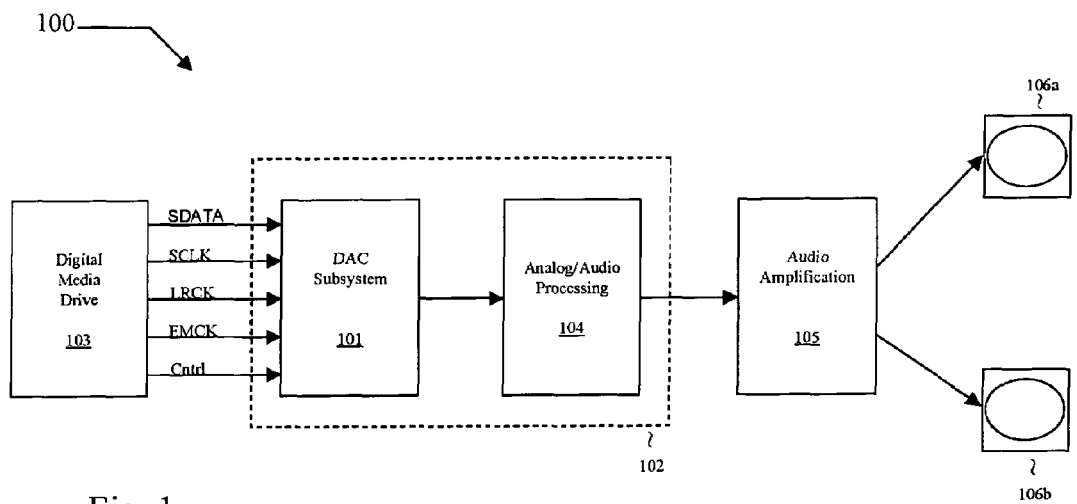
FIG. 1 is a diagram of a typical audio system suitable for describing the utilization of a digital-to-analog converter subsystem (DAC) according to the principles of the present invention.

FIG. 1 is a diagram of a typical audio system 100 suitable for describing the utilization of a digital-to-analog converter subsystem (DAC) 101 according to the principles of the present invention. In this example, DAC subsystem 101 forms part of an audio component 102, such as a compact disk (CD) player, digital audio tape (DAT) player, or digital versatile disk (DVD) unit. A digital media drive 103 recovers the digital data from the given storage media and passes those data, along with clocks and control signals, to DAC subsystem 101. The resulting analog (audio) signal undergoes further processing in analog/audio processing block 104 prior to amplification in audio amplification block 105. Audio amplification block 105 then drives a set of conventional speakers 106a and 106b, or a headset (not shown).

Multi-bit digital audio data is received by DAC subsystem 100 serially through the SDATA pin timed by the serial clock (SCLK) signal. The left and right channel data are alternately processed in response to the left-right clock (LRCK) signal, which is normally at the sampling rate. In system 100, the external master clock (EMCK) signal is received by DAC subsystem 101 from digital media drive 103.

Figure 2:
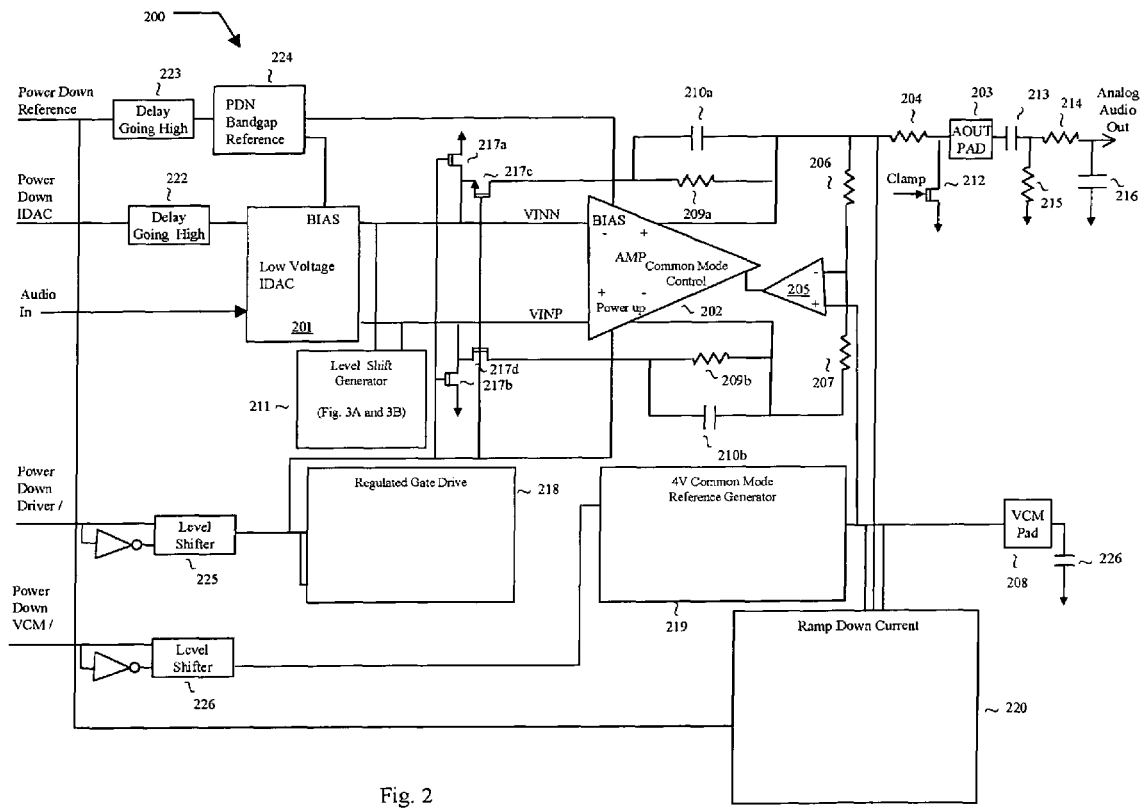
FIG. 2 is an electrical schematic diagram of an exemplary DAC subsystem embodying the principles of the present invention.

FIG. 2 is a block diagram of a digital to analog converter (DAC) 200 embodying the principles of the present invention, and which forms a portion of DAC subsystem 101 of FIG. 1. In the illustrated embodiment, DAC 200 receives a channel of digital audio data AUDIO IN and outputs an analog audio output signal ANALOG AUDIO OUT. Although, the illustrated embodiment of DAC 200 is suitable for such applications as digital audio system 100 of FIG. 1, its utilization is not limited to audio systems, and therefore DAC 200 may be utilized in a range of systems applications requiring the conversion of digital data into analog form.

The digital stream AUDIO IN is input into a low voltage current-based (continuous-time) digital to analog converter (IDAC) 201. The differential outputs of IDAC 201, after the voltage level shifting discussed further below, drive corresponding inverting (−) and noninverting (+) low voltage inputs of an operational amplifier stage 202. Operational amplifier 202 also includes differential inverting (−) and noninverting (+) outputs, with the noninverting (+) output of operational amplifier 202 driving analog output (AOUT) pad 203 through resistor 204.

Operational amplifier 202 operates around an input common mode voltage of approximately one (1) volt. The common mode output voltage for operational amplifier 202 is approximately 4 volts and is controlled by common mode amplifier 205. The voltage at the inverting (−) input to common mode amplifier 205 is set by a voltage divider formed by resistors 206 and 207 bridging the noninverting (+) and inverting (−) outputs of operational amplifier 202. The noninverting (+) input to common mode amplifier 205 is tied to the common mode voltage (VCM) reference pad 208.

Differential operational amplifier 202 is associated with two feedback loops, one, which couples the inverting (−) input and the noninverting (+) output of operational amplifier 202, includes a feedback resistor 209a and a feedback capacitor 210a. The second feedback loop, which couples the noninverting (+) input and the inverting (−) output of operational amplifier 202, includes a feedback resistor 209b and a feedback capacitor 210b. A level shift generator 211 ensures that an approximately three (3) volt voltage drop exists across resistors 209a and 209b such that the inputs to operational amplifier 202 remain within a safe operating voltage range, since low voltage differential input transistors are utilized in operational amplifier 202 to save chip area. Generally, a low voltage n-type metal oxide semiconductor [NMOS] transistor has a channel length approximately eight or nine times shorter than that of a high voltage NMOS transistor. Additionally, low voltage MOS transistors typically help reduce total harmonic distortion, since the gate voltage swing is lower, and have better overall noise performance.

A clamp transistor 212 at analog output (AOUT) pad 203 clamps the voltage at output pad 203, in response to the control signal CLAMP, to reduce glitches when powering—up opamp 202. The remaining external load presented to analog output (AOUT) pad 203 is represented in FIG. 2 by filtering resistors 214 and 215 and a filtering capacitor 216.

Isolation transistors 217c and 217d under the control of regulated gate drive 218 respectively isolate the inverting (−) and noninverting (+) inputs of operational amplifier 202 from output pad (AOUT) 203 during the power down operations. Specifically, isolation transistors 217c and 217d prevent current flow from external AC coupling cap 213 and thereby prevent the generation of a large voltage spike, and consequently an audible pop, in the signal ANALOG AUDIO OUT. Pull-down transistors 217a and 217b, also under the control of regulated gate drive 218, respectively pull the inverting (−) and noninverting (+) inputs of operational amplifier 202 to a known voltage, in the illustrated embodiment to ground, after isolation transistors 217c and 217d turn-off.

Common mode reference generator 219 generates a common mode reference voltage at VCM pad 208 and the noninverting (+) input of common mode amplifier 205. Common mode reference generator 219 powers down after operational amplifier 202. During power-down, currents through output (AOUT) pad 203 and VCM pad 208 are controlled by ramp down current generator 220 of FIG. 2.

Returning to FIG. 2, power down of IDAC 202 is controlled by the control SIGNAL POWER DOWN IDAC as delayed by delay 222. The control signal POWER DOWN REFERENCE, as delayed through delay 223, controls power-down of bandgap reference 224, which provides the bias currents to IDAC 201 and operational amplifier 202. Level shifters 225 and 226 shift the low level control signals DRIVER POWER DOWN\ and POWER DOWN VCM\, generated from a low voltage power supply, to the higher levels required by the circuitry of VCM generator 219 and regulated gate drive 218. To prevent pops in the audio output, the outputs of level shifters 226 and 225 go to a known state and shutdown operational amplifier 202, if the low voltage supply is removed before the high voltage supply.

Figure 3A:
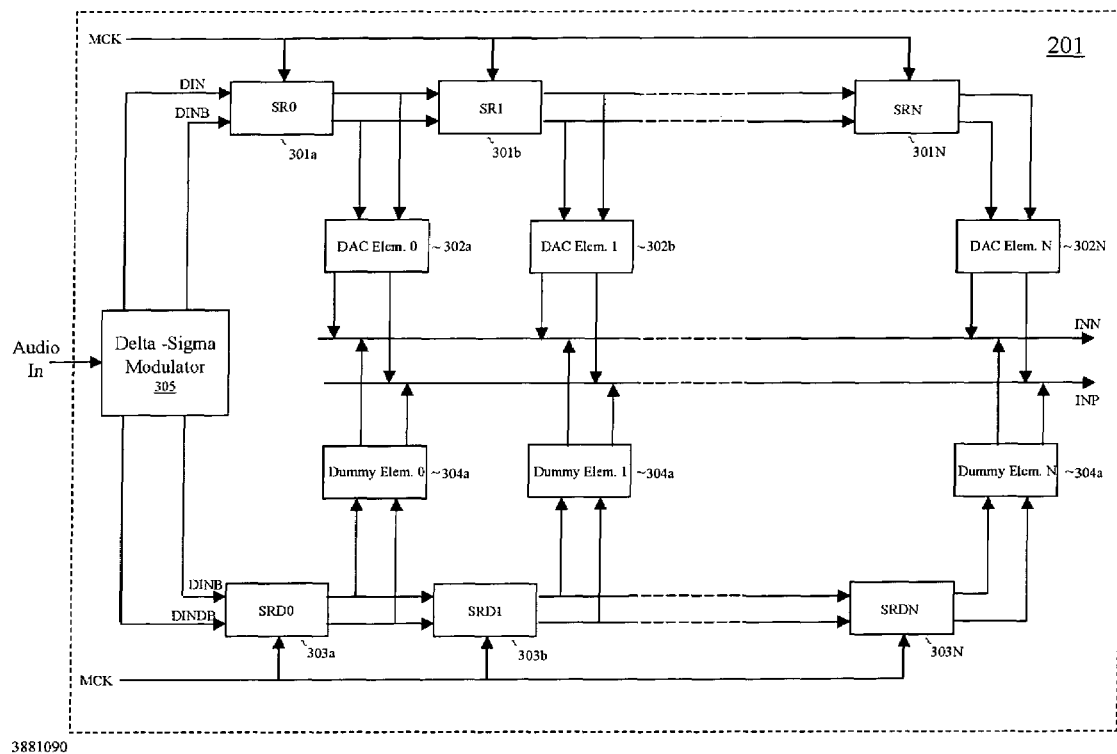
FIG. 3A is a more detailed block diagram of the current DAC shown in FIG. 2.

FIG. 3A is a block diagram showing an N-element embodiment of IDAC array 201 of FIG. 2. In the illustrated embodiment, complementary input data streams DIN and DINB from the quantizer of a delta-sigma modulator are shifted through a set of one-bit shift register (SR) elements 301a, . . . , 301N by the master clock signal MCK, in which N is an integer index. The output of each shift register element 301a, . . . , 301N drives a corresponding DAC element 301a, . . . , 301N. The resulting overlapping analog output signals drive signal lines INN and INP to the summing nodes at the inputs of opamp 202 of FIG. 2.

Figure 3B:
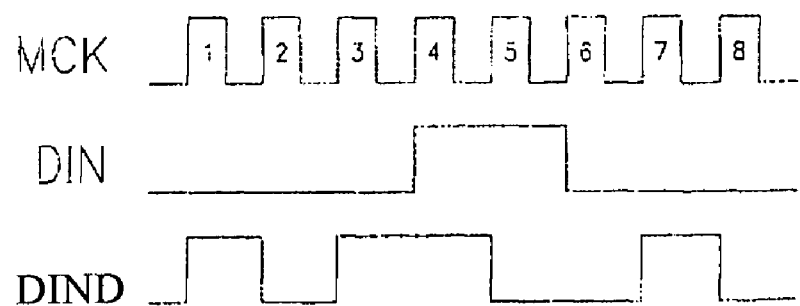
FIG. 3B is a timing diagram of exemplary signals controlling the operation of the current DAC shown in FIGS. 2 and 3A.

A second set of dummy one-bit shift register elements 303a, . . . , 303N shift complementary dummy input data streams DIND and DINDB in response to the MCK signal. FIG. 3B illustrates a selected number of cycles of the MCK, DIN and DIND signals for an embodiment where N is equal to eight. Dummy data streams DIND and DINB are generated relative to the input data streams DIN and DINB such that for every rising edge of the MCK signal, a corresponding edge (rising or falling) occurs on either input data stream DIN or dummy data stream DIND. The outputs from shift register elements 303a, . . . , 303N drive a corresponding set of dummy conversion elements 304a, . . . , 304N coupled to signal lines INN and INP. Each dummy conversion element 304a, . . . , 304N has a capacitance matched to the capacitance of a corresponding DAC element 302a, . . . , 302N.

Figure 4A:
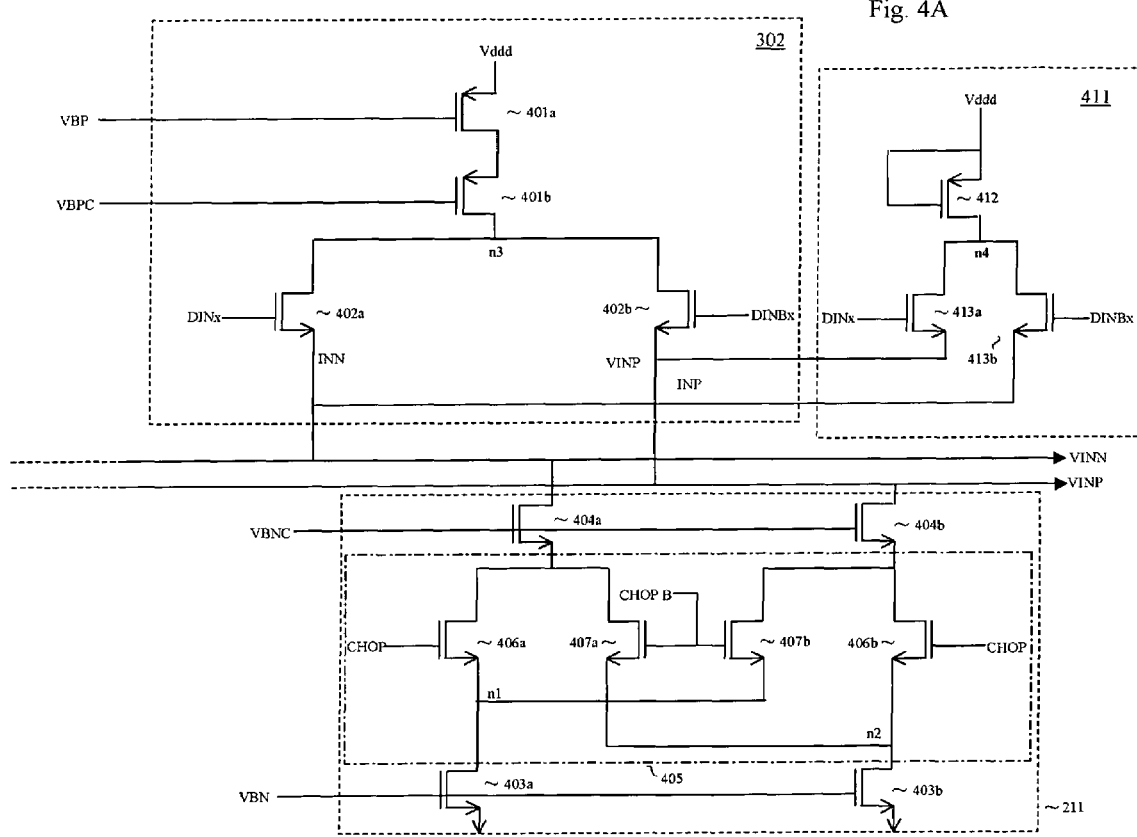
FIG. 4A is an electrical schematic illustrating in further detail a digital to analog conversion element of the current-based DAC array shown in FIG. 3A and associated level—shifting circuitry.

FIG. 4A shows one exemplary current DAC element 302a, . . . , N from IDAC array 201 of FIGS. 2 and 3A, along with a more detailed electrical schematic diagram of level shifter 211 of FIG. 2.

The exemplary current element depicted in FIG. 4A includes a pair of low voltage PMOS transistors 401a and 401b respectively biased by the bias voltages VBP and VBPC. In the illustrated embodiment, low voltage PMOS transistors 401a and 401b are formed in an isolated well of n-type semiconductor (N-well), to minimize substrate noise coupling into IDAC 201, and save chip area. The current through PMOS transistors 401a and 401b from the voltage rail Vdda feed the current paths of NMOS transistors 402a and 402b. The gates of NMOS transistors 402a-402b are respectively driven by corresponding complementary digital data input bits $DIN_x$ and $DINB_x$ from the outputs of the corresponding shift register element 301a, . . . , N of FIG. 3A, in which x is an integer index from 0 to N. The sources of NMOS transistors 402a and 402b are coupled to the outputs INN and INP of IDAC 201 of FIG. 2. The remaining DAC elements 302a, ..., N of IDAC 201 (not shown) are similarly configured and similarly coupled to the outputs INN and INP, which are in turn connected to the inverting (−) and non-inverting (+) summing nodes of operational amplifier 202 of FIG. 2.

The voltage level shifting operations of voltage level generator 211, discussed above in conjunction with FIG. 2, are implemented by a pair of identical NMOS current source transistors 403a and 403b, biased by the bias voltage VBN. The current through NMOS current source transistors 403a and 403b is set, in the illustrated embodiment, to produce a voltage drop of approximately three (3) volts across operational amplifier feedback transistors 209a and 209b of FIG. 2. Any noise in the bias signal VBN is advantageously attenuated by the internal common mode feedback loop within operational amplifier 202.

Current source transistors 403a and 403b operate in conjunction with a pair of NMOS cascode transistors 404a and 404b, biased by the bias voltage VBNC, and a chopper circuit 405. Chopper circuit 405 includes a pair of NMOS transistors 406a and 406b switching in response to the control signal CHOP and a pair of NMOS transistors 407a and 407b operating in response to the complementary control signal CHOPB.

Figure 4B:
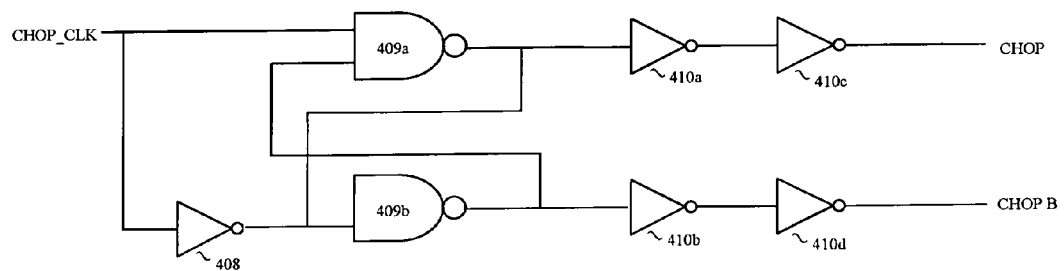
FIG. 4B is an electrical schematic diagram of exemplary control signal generation circuitry suitable for generating the chopping control signals shown in FIG. 3A.

FIG. 4B illustrates one exemplary circuit suitable for generating the non-overlapping control signals CHOP and CHOPB. In the illustrated embodiment of FIG. 4B, the chopping control signal CHOP and CHOPB are generated from a high frequency clock CHOP_CLK which is generated from the clock driving the digital data being converted. The circuitry of FIG. 4B includes an input inverter 408, a pair of cross-coupled NAND gates 409a and 409b, and a set of inverter/drivers 410a-410d.

Current source transistors 403a and 403b of FIG. 4A generate intrinsic low frequency flicker (1/F) noise, which generally has a power spectral density which is inversely proportional to frequency. According to the principles of the present invention, chopping circuitry 405 chops the NMOS current source transistors 403a and 403b at a high frequency and therefore shifts (modulates) the flicker noise spectrum to much higher out-of-band frequencies. Consequently, the overall noise generated by level shifting circuitry 211 within the signal band of the output signal ANALOG AUDIO OUT of FIG. 2 is reduced.

Each DAC element 302a, ..., 302N of FIG. 3A is associated with a corresponding dummy circuit 411, as shown in FIG. 4A. In the illustrated embodiment, each dummy circuit 411 includes a PMOS transistor 412, with the gate shorted to the source, and a pair of NMOS transistors 413a and 413b, having gates controlled by the complementary data bits $DIN_x$ and $DINB_x$. The sources of NMOS transistors 413a and 413b are respectively coupled to the signal lines INP and INN and cross-coupled to the sources of NMOS transistors 402a and 402b of the corresponding DAC element 302a, ..., 302N. The parasitic capacitances at nodes n3 of DAC element 302a, ..., 302N and n4 of corresponding dummy circuit 411 of FIG. 4A are matched.

The dummy element 411 associated with each DAC element 302a, ..., 302N makes the load on signal lines INN and INP independent of the corresponding input bits $DIN_x$ and $DINB_x$, reduces the instantaneous differential current change ("kick") on signal lines INN and INP, and improves the power supply rejection ratio (PSRR) on the input bits $DIN_x$ and $DINB_x$. For example, when data bit $DIN_x$ is high and the complementary bit $DINB_x$ is low, the parasitic capacitance at node n3 of exemplary DAC element 302a, ..., N of FIG. 4A is coupled to the INN signal line through transistor 402a while the matched capacitance at node n4 of dummy cell 411 is coupled to the INP signal line through transistor 413a. Consequently, the capacitive load on signal lines INN and INP is independent of the states of $DIN_x$ and $DINB_x$, and the resulting instantaneous differential current change on signal lines INN and INP is reduced. Furthermore, noise associated with the input bits $DIN_x$ and $DINB_x$ is coupled to both signal lines INN and INP by transistors 402a-402b and 413a-413b as common mode noise, which is subsequently zeroed—out by the common mode loop internal to opamp 202 of FIG. 2.

Figure 5:
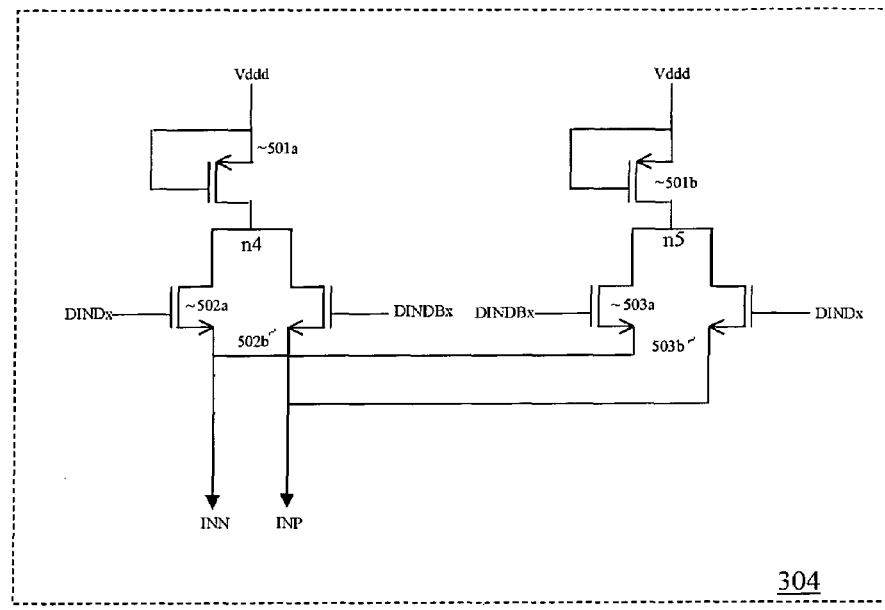
FIG. 5 is an electrical schematic diagram of an exemplary dummy element shown in FIG. 3A.

FIG. 5 is an electrical schematic diagram of a representative dummy element 304a, ..., 304N shown in FIG. 3A. Each dummy element 304a, ..., 304N includes a pair of PMOS transistors 501a and 501b having gates and sources coupled together and to the supply voltage Vdda. The drain of transistor 501a is coupled to the drains of a pair of NMOS transistors 502a and 502b having gates respectively controlled by the dummy data bits $DIND_x$ and $DINDB_x$ from the corresponding dummy shifter register element 303a, ..., 303N of FIG. 3A. The drain of transistor 501b is coupled to the drains of NMOS transistors 503a and 503b, which have gates respectively controlled by the dummy bits $DINDB_x$ and $DIND_x$. The sources of transistors 502a and 502b are then cross-coupled with the sources of transistors 503a and 503b and the signal lines INN and INP. The parasitic capacitance at nodes n5 and n6 match the capacitance at nodes n3 and n4 of a corresponding DAC element 302a, ..., N, of FIG. 4A.

Returning to FIG. 2, in the illustrated embodiment of digital to analog converter 200, the voltages at the inverting (−) and noninverting (+) inputs of operational amplifier 202 do not completely settle during data conversion operations. Chopping circuitry 405 of FIG. 4A is disposed between NMOS current source transistors 403a and 403b and NMOS cascode transistors 404a and 404b. The gain of cascode transistors 404a and 404b advantageously reduces the effects of the non-settled voltage at the inverting and non-inverting inputs of operations amplifier 202 during charging and discharging of the parasitic capacitance at the chopping nodes n1 and n2 of FIG. 4A. As a result, the process of chopping the flicker noise generated by NMOS current source transistors 403a and 403b is independent of the non-settled voltage at the INN and INP nodes.

In the illustrated embodiment, the data bits $DIN_x$ and $DINB_x$ output from each shift register 301a, ..., 301N of FIG. 3A overlap to ensure that transistors 402a and 402b shown in FIG. 4A for DAC elements 302a, ..., 302N do not simultaneously turn-off and thereby cause a glitch on the INN and INP data lines and the inputs of opamp 202 of FIG. 2. Instead, during the overlap period of bits $DIN_x$ and $DINB_x$, both transistors 402a and 402b turn-on, which results in a short between the sources of transistors 402a-402b in FIG. 4A. Specifically, since the voltages at the inputs to opamp 202 of FIG. 2 do not settle completely, the remaining voltage between INN and INP is sampled onto the parasitic capacitance on nodes n3 and n4. Subsequently, on the following rising edges of bits $DIN_x$ and $DINB_x$, the high frequency noise stored on nodes n3 and n4 are mixed through transistors 402a and 402b on to the signal lines INN and INP, as noise and distortion folding into the audio signal baseband.

According to the principles of the present invention, overlapping dummy bits $DIND_x$ and $DINDB_x$ of FIG. 5, generated from dummy data streams DIND and DINDB of FIGS. 3A and 3B, ensure that, for each DAC element 302a, ..., 302N which does not switch for a given rising edge of the MCK signal, the corresponding dummy element 304a, ..., 304N does switch, and vice-versa. For that dummy element 304a, ..., 304N, the parasitic capacitances at nodes n5 and n6, shown in FIG. 5, are impressed with the time-dependent signal. During the subsequent transitions of $DIND_x$ and $DINDB_x$, the signal impressed on the capacitances of nodes n5 and n6 are transferred to the INN and INP signal lines through transistors 503a-503b and 502a-502b, depending on the polarity of $DIND_x$ and $DINDB_x$. During the overlap period of bits $DIND_x$ and $DINDB_x$, both transistors 502a-502b turn on, which results in a short between the sources of transistors 502a-502b. This results in a charge transfer between INN and INP data lines.

Overall, the total contribution of noise and distortion on signal lines INN and INP becomes dependent on the MCK signal rather than on the data signals DIN and DINB. In the illustrated embodiment, the noise transfer function of delta—sigma modulator 305 is then designed to have a minimum noise floor with respect to the known frequency of the MCK signal such that the mixing of high frequencies on the signal lines is more controlled and the fold back of noise into the signal baseband can be minimized.

While a particular embodiment of the invention has been shown and described, changes and modifications may be made therein without departing from the invention in its broader aspects, and, therefore, the aim in the appended claims is to cover all such changes and modifications as fall within the true spirit and scope of the invention.

What is claimed is:

1. A circuit comprising:
a first element sampling noise from and discharging noise to a signal line by switching a parasitic capacitance to the signal line in response to an input signal transitioning on selected edges of a clock signal; and
a second element sampling noise from and discharging noise to the signal line in response to another input signal transitioning on other edges of the clock signal differing from the selected edges of the clock signal such that a sampling and discharging frequency on the signal line is independent of the input signal and the other input signal.

2. The circuit of claim 1, wherein the other edges of the clock signal are selected such that the sampling and discharging frequency on the signal line relates to a frequency of the clock signal.

3. The circuit of claim 1, wherein the first element further comprises a dummy circuit switching a matching parasitic capacitance to the signal line in response to the complement of the input signal; and, wherein the second element selectively switches a parasitic capacitance to the signal line in response to the another input signal, and further comprises a dummy circuit switching another matching parasitic capacitance to the signal line in response to the complement of the another input signal.

4. The circuit of claim 1, further comprising an operational amplifier having an input coupled to the signal line.

5. The circuit of claim 1, wherein a selected one of loads of the first and second elements is coupled to the signal line in response to each edge of the clock signal.

6. The circuit of claim 1, wherein the first element comprises a data conversion element and the second element comprises a dummy data conversion element.

7. The circuit of claim 1, wherein the second element samples noise from and discharges noise to the signal line in response to the another input signal by switching another parasitic capacitance to the signal line.

8. A method of reducing noise on a signal line comprising:
sampling noise from and discharging noise to a signal line by switching a parasitic capacitance to the signal line in response to an input signal transitioning on selected edges of a clock signal; and
sampling noise from and discharging noise to the signal line in response to another input signal transitioning on other edges of the clock signal differing from the selected edges of the clock signal such that a sampling and discharging frequency signal line is independent of the input signal and the other input signal.

9. The method of claim 8, wherein the other edges of the clock signal are selected such that noise on the signal line relates to a frequency of the clock signal.

10. The method of claim 8, wherein sampling noise from and discharging noise to the signal line in response to the another input signal comprises switching a parasitic capacitance to the signal line in response to the another input signal.

11. The method of claim 8, wherein noise is sampled from and discharged to the signal line on every edge of the clock signal.

12. A digital to analog converter comprising:
an operational amplifier having differential inputs coupled to a pair of differential signal lines;
a data conversion element for selectively switching a signal onto a selected one of the pair of differential signal lines in response to an input signal transitioning in response to corresponding edges of a clock signal, the data conversion element having a capacitance; and
a dummy conversion element for selectively coupling a capacitance matching the capacitance of the data conversion element to a selected one of the pair of signal lines in response to an other input signal, the other input signal transitioning on other edges of the clock signal such that a sampling and discharging rate on the signal lines relates to a frequency of the clock signal.

13. The digital to analog converter of claim 12, further comprising a dummy circuit cross-coupled to the data conversion element and having a dummy capacitance matching the capacitance of the data conversion element, the dummy circuit coupling the dummy capacitance to a selected one of the pair of signal lines in response to the complement of the input signal, and a dummy circuit cross-coupled to the dummy conversion element and having a dummy capacitance matching the capacitance of the dummy conversion element, the dummy circuit coupling the dummy capacitance of a selected one of the signal lines in response to the complement of the other input signal.

14. The digital to analog converter of claim 12, wherein the data conversion element comprises a current digital to analog conversion element.

15. The digital to analog converter of claim 12, wherein the data conversion element comprises one of an array of data conversion elements and the dummy conversion element comprises one of an array of dummy conversion elements corresponding to the array of data conversion elements.

16. The digital to analog converter of claim 12, further comprising a delta-sigma modulator providing the input signal to the data conversion element.

17. The digital to analog converter of claim 12, wherein a selected one of the capacitance of the data conversion element and the capacitance of dummy data conversion element is coupled to the selected one of the signal lines on every edge of the clock signal.

18. The digital to analog converter of claim 12, wherein the input signal and the complement of the input signal overlap to cause a charge transfer between the signal lines.

19. A method of controlling noise comprising:
coupling a node having a parasitic capacitance to a signal line in response to an input signal transitioning on selected edges of a clock signal to sample and discharge noise from and to the signal line; and
coupling a matching node to the signal line in response to another input signal transitioning on other selected edges of the clock signal to sample and discharge noise from and to the signal line such that is sampled from and discharged to the signal line at a frequency that relates to a frequency of the clock signal.

20. The method of claim 19, wherein coupling a node to the signal line comprises coupling a data conversion element to the signal line.

21. The method of claim 20, wherein coupling a matching node to the signal line comprises coupling another data conversion element matching the data conversion element to the signal line in response to the another input signal.

22. The method of claim 19, wherein coupling a matching node to the signal line in response to another input signal comprises coupling a matching node having another parasitic capacitance to the signal line.

23. A shift register comprising;
   a first set of shift register elements associated with a first set of parasitic capacitive loads and presenting data on a corresponding signal line in response to a first input signal; and
   a second set of shift register elements associated with a second set of loads and presenting data on the signal line in response to a second input signal such that a system loading is independent of the first and second input signals.

24. The shift register of claim 23, wherein the system loading comprises loading on a substrate.

25. The shift register of claim 23, wherein the system loading comprises loading on a power supply.

26. The shift register of claim 23 wherein the second set of shift register elements are associated with a second set of parasitic loads.

27. A current element array controlled by a shift register, comprising:
   an operational amplifier having an input coupled to a signal line;
   a set of current elements each having complementary outputs; and
   a set of dummy circuits selectively coupling the set of current elements to the signal line such that a load on the signal line and signal settling at the input of the operational amplifier are independent of an input signal to the current element array.

28. The current element array of claim 27, wherein the sets of current elements and dummy circuits comprise matched sets of data conversion elements.

* * * * *